United States Patent
Yoshimoto et al.

[19]

[11] Patent Number: 6,049,260
[45] Date of Patent: Apr. 11, 2000

[54] SURFACE ACOUSTIC WAVE FILTER HAVING PARAMETERS OPTIMIZED TO SUPPRESS SPURIOUS SIGNALS

[75] Inventors: Susumu Yoshimoto; Yasushi Yamamoto, both of Tokyo, Japan

[73] Assignee: NEC Corporation, Tokyo, Japan

[21] Appl. No.: 09/231,657

[22] Filed: Jan. 15, 1999

[30] Foreign Application Priority Data

Jan. 16, 1998 [JP] Japan .................................. 10-020313

[51] Int. Cl.$^7$ ...................................................... H03H 9/64
[52] U.S. Cl. ...................... 333/194; 333/195; 310/313 D
[58] Field of Search ................................... 333/193–196; 310/313 R, 313 B, 313 C, 313 D

[56] References Cited

U.S. PATENT DOCUMENTS

| | | | |
|---|---|---|---|
| 4,635,009 | 1/1987 | Ebata ........................................ | 333/195 |
| 5,365,138 | 11/1994 | Saw et al. ............................ | 310/313 D |
| 5,568,001 | 10/1996 | Davenport ....................... | 310/313 D X |
| 5,666,092 | 9/1997 | Yamamoto et al. ..................... | 333/194 |
| 5,874,869 | 2/1999 | Ueda et al. .......................... | 333/195 X |
| 5,895,996 | 4/1999 | Takagi et al. ....................... | 310/313 R |

FOREIGN PATENT DOCUMENTS

| | | |
|---|---|---|
| 63-194406 | 8/1988 | Japan . |
| 1-231417 | 9/1989 | Japan . |
| 3-296316 | 12/1991 | Japan . |
| 4-259109 | 9/1992 | Japan . |
| 4-265009 | 9/1992 | Japan . |
| 5-7124 | 1/1993 | Japan . |
| 5-121996 | 5/1993 | Japan . |

*Primary Examiner*—Benny Lee
*Assistant Examiner*—Barbara Summons
*Attorney, Agent, or Firm*—McGinn & Gibb, P.C.

[57] ABSTRACT

A surface acoustic wave filter includes IDTs on an input side and on an output side, the Inter Digital Transducers (IDTs) are formed by depositing a thin film made of aluminum and the like on a piezoelectric substrate made of crystal, and disposed on the substrate with a spacing interposed therebetween. The width of each electrode digit of each IDT is ¼ of the wavelength of the surface acoustic wave during resonance. A reflection coefficient $\epsilon$ per electrode digit and the total number N of pairs of the electrode digits constituting the IDTs on the input side and on the output side are set to satisfy $N\epsilon \geq 0.55$. Also, the aperture width $W\lambda$ of a surface acoustic wave transmission path, the center frequency of the filter f in units of Hertz, and the thickness of the electrode digits H in units of meters, are set to satisfy $fH \leq -17.5W+210$.

11 Claims, 6 Drawing Sheets

SURFACE ACOUSTIC WAVE FILTER HAVING PARAMETERS OPTIMIZED TO SUPPRESS SPURIOUS SIGNALS

BACKGROUND OF THE INVENTION

1. Field of the Invention

The present invention relates to a surface acoustic wave filter in which IDTs (Inter Digital Transducer) on an input side and on an output side each made of a plurality of electrode digits are formed on a piezoelectric substrate with a spacing interposed therebetween.

2. Description of the Related Art

FIG. 1 is a plan view showing an example of a conventional surface acoustic wave filter. This surface acoustic wave filter 102 has IDTs 106, 108 on an input side and on an output side, which are surface acoustic waves transducers, formed with a spacing interposed therebetween on piezoelectric substrate 104 made of crystal and the like. The width of each electrode digit of each of IDTs 106, 108 is $\lambda/4$ where $\lambda$ is the wavelength of the surface acoustic wave during resonance. One electrode 114 of IDTs 106, 108 are connected to input terminal 116 and output terminal 118 the other electrodes 120 are both grounded.

In this surface acoustic wave filter 102, when an alternating signal is supplied from input terminal 116, IDT 106 causes a surface acoustic wave to be excited on piezoelectric substrate 104. The wave is propagated in a direction orthogonal to the extending direction of each electrode digit 112 constituting IDT 106, forms a standing wave while repeating multiple reflection between IDTs 106 and 108, and is received in IDT 108 and then outputted from output terminal 118 as an electric signal.

Surface acoustic wave filter 102 having such construction as described above is also referred to as a vertical mode resonator type surface acoustic wave filter since the surface acoustic wave is propagated in the vertical direction and the resonance of the modes distributed in the same direction as the propagated direction is utilized.

FIG. 2 is a graph showing the frequency characteristic of surface acoustic wave filter 102. In this figure, the horizontal axis represents the frequency and the vertical axis represents the attenuation factor, respectively.

An ideal characteristic for surface acoustic wave filter 102 which is a band-pass filter is to pass signals only in the pass-band near the center frequency f. However, signals are actually passed in some degree even at a point away from the center frequency, which phenomenon appears as a spurious signal in the frequency characteristic.

Particularly, in surface acoustic wave filter 102 which is a vertical mode resonator type surface acoustic wave filter, a typical spurious signal 122 occurs in a region higher than the center frequency, which causes a reduction in the amount of attenuation out of the band and a deterioration in the frequency characteristic as a band-pass filter.

SUMMARY OF THE INVENTION

It is therefore an object of the present invention to provide a surface acoustic wave filter having an improved frequency characteristic by suppressing the occurrence of such a spurious signal typical of the vertical mode resonator type surface acoustic wave filter.

In order to achieve the above object, in a surface acoustic wave filter according to the present invention, $N\epsilon \geq 0.55$ is satisfied where $\epsilon$ is a reflection coefficient of an electrode digit and N is the total number of pairs of the electrode digits constituting IDTs on an input side and on an output side, and $fH \leq -17.5W+210$ is satisfied where $W\lambda$ is the aperture width of the surface acoustic wave transmission path formed of the IDTs on the input side and on the output side, f(Hz) is the center frequency of the filter, and H(m) is the thickness of the electrode digits.

Since the reflection coefficient $\epsilon$ of the electrode digit and the total number N of the pairs of the electrode digits of the IDT are set to satisfy $N\epsilon \geq 0.55$ and the aperture width W of the surface acoustic wave transmission path, the center frequency f of the filter, and the thickness H of the electrode digits are set to satisfy $fH \leq -17.5W+210$, bulk mode transformation in the IDT is increased. As a result, the spurious signal typical of the vertical mode resonator type surface acoustic wave filter is suppressed, thereby improving the frequency characteristic as a band-pass filter.

The above and other objects, features and advantages of the present invention will become apparent from the following description with reference to the accompanying drawings which illustrate examples of the present invention.

DESCRIPTION OF THE PREFERRED EMBODIMENTS

Figure 3:
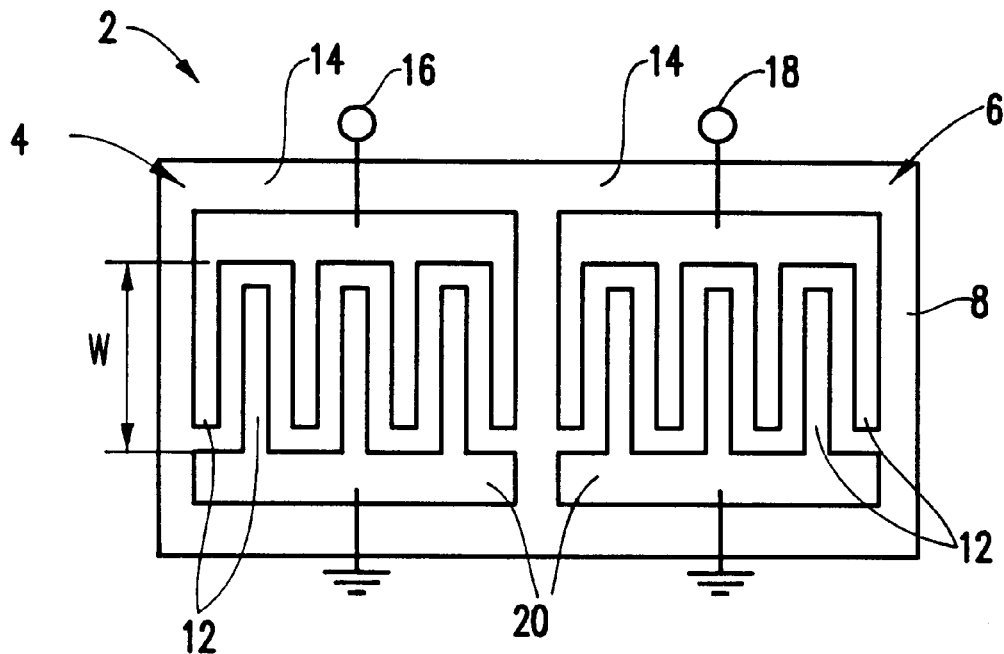
FIG. 3 is a plan view of a surface acoustic wave filter according to a first embodiment of the present invention.

Referring now to FIG. 3, surface acoustic wave filter 2 according to a first embodiment of the present invention is a vertical mode resonator type surface acoustic wave filter serving as a band-pass filter and includes IDTs 4, 6 on an input side and on an output side. IDTs 4, 6 are formed by depositing a thin film made of aluminum or an alloy of aluminum on ST cut crystal substrate 8 (hereinafter also referred to as piezoelectric substrate 8) and disposed on piezoelectric substrate 8 with a spacing interposed therebetween.

Each of IDTs 4, 6 is made of plurality of pairs of inter digital shape electrodes. The width of each electrode digit 12 is $\lambda/4$ where $\lambda$ is the wavelength of the surface acoustic wave during resonance. One electrodes 14 of IDTs 4, 6 are connected to input terminal 16 and output terminal 18, respectively, and the other electrodes 20 are both grounded.

In this embodiment, a reflection coefficient per electrode digit (i.e. acoustic impedance discontinuous coefficient) $\epsilon$, and the total number N of the pairs of the electrode digits constituting IDTs 4, 6 on the input side and on the output side are set to satisfy the following equation;

$$N\epsilon \geq 0.55 \tag{1}$$

It should be noted that the setting the product of the total number N of the pairs of the electrode digits and the reflection coefficient $\epsilon$ to be 0.55 or more is equivalent to the setting the reflection coefficient of the overall surface waveguide path to be 1.5 or more. This value can be realized with the existing technology in a vertical mode resonator type surface acoustic wave filter having a usual constitution such as surface acoustic wave filter 2 of this embodiment.

The aperture width W$\lambda$ of the surface acoustic wave transmission path formed of IDTs 4, 6, the center frequency f of the filter, and the thickness H(m) of the electrode digits are set to satisfy the equation (2). The aperture width W$\lambda$ indicates that the aperture width is W times the wavelength of the surface acoustic wave in a resonant state.

$$fH \leq -17.5W + 210 \tag{2}$$

In order to satisfy the equation (2), the aperture width W of the surface acoustic wave transmission path is shorter than that of a conventional surface acoustic wave filter when the center frequency f and the thickness H of the electrode digits are those as conventional.

The basic operation of surface acoustic wave filter 2 constituted as described above is the same as that of conventional surface acoustic wave filter 102. Specifically, when an alternating signal is supplied from input terminal 16, IDT 4 causes the surface acoustic wave to be excited on piezoelectric substrate 8. The wave is propagated in a direction orthogonal to the extending direction of each electrode digit 12 constituting IDT, forms a standing wave while repeating multiple reflection between IDTs 4 and 6, and is received in IDT 6 and then outputted from output terminal 18 as an electric signal.

However, in surface acoustic wave filter 2 of this embodiment, the above parameters are set to satisfy the equation (1) and the equation (2) so that the bulk mode transformation in IDTs 4, 6 is increased. As a result, the spurious signal typical of the vertical mode resonator type surface acoustic wave filter is suppressed, thereby improving the frequency characteristic as a bandpass filter.

Figure 4:
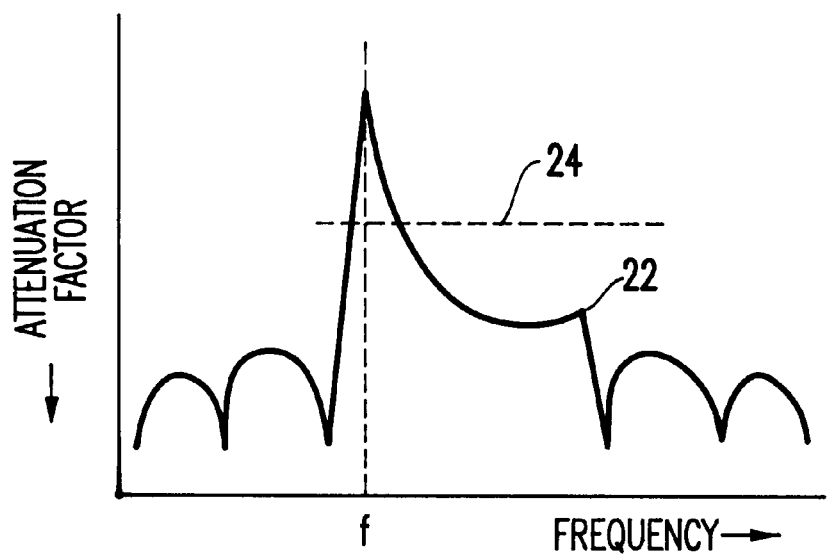
FIG. 4 is a graph showing the frequency characteristic of the surface acoustic wave filter of FIG. 3.

FIG. 4 is a graph showing the frequency characteristic of surface acoustic wave filter 2, in which the horizontal axis represents the frequency and the vertical axis represents the attenuation factor, respectively.

Figure 1:
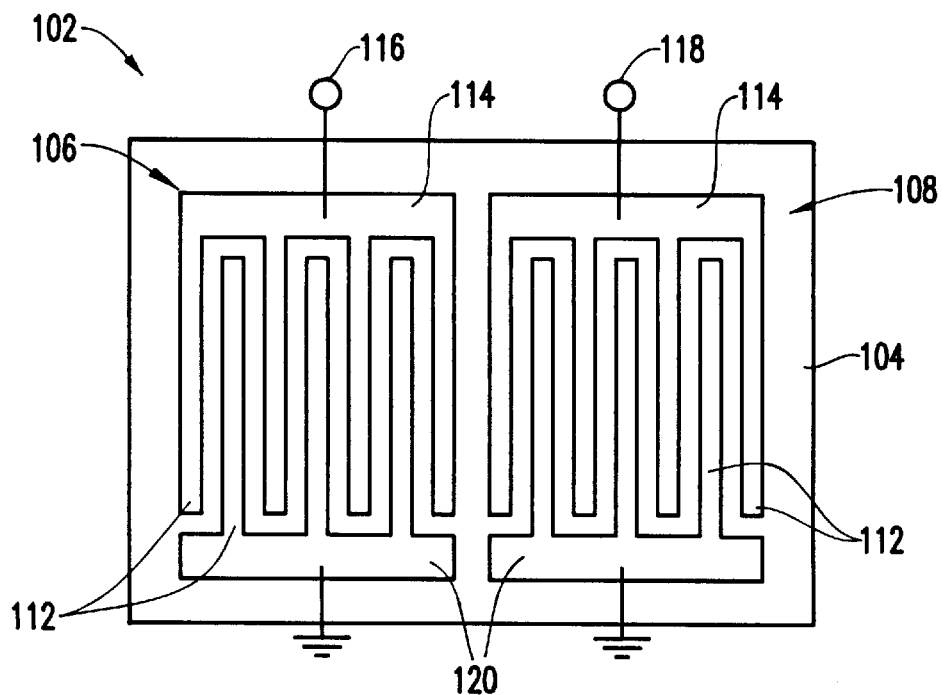
FIG. 1 is a plan view showing an example of a conventional surface acoustic wave filter.
Figure 2:
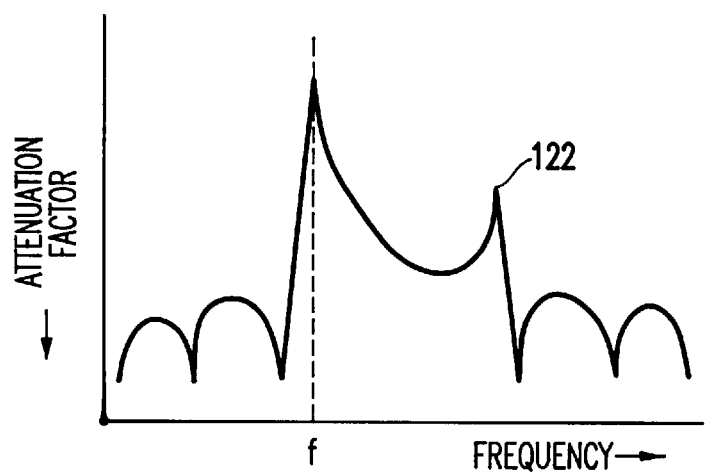
FIG. 2 is a graph showing the frequency characteristic of the surface acoustic wave filter in FIG. 1.

As can be seen from the comparison of FIG. 4 with FIG. 2 showing the frequency characteristic of the conventional surface acoustic wave filter 102, in surface acoustic wave filter 2 of this embodiment, spurious signal 22 typical of a vertical mode resonator type surface acoustic wave filter occurring on the higher side than the center frequency f is greatly reduced, improving the frequency characteristic as a pass-band filter. In FIG. 4, dotted line 24 represents the level of spurious signal 122 in the case of the conventional surface acoustic wave filter 102 (FIG. 2).

Figure 5:
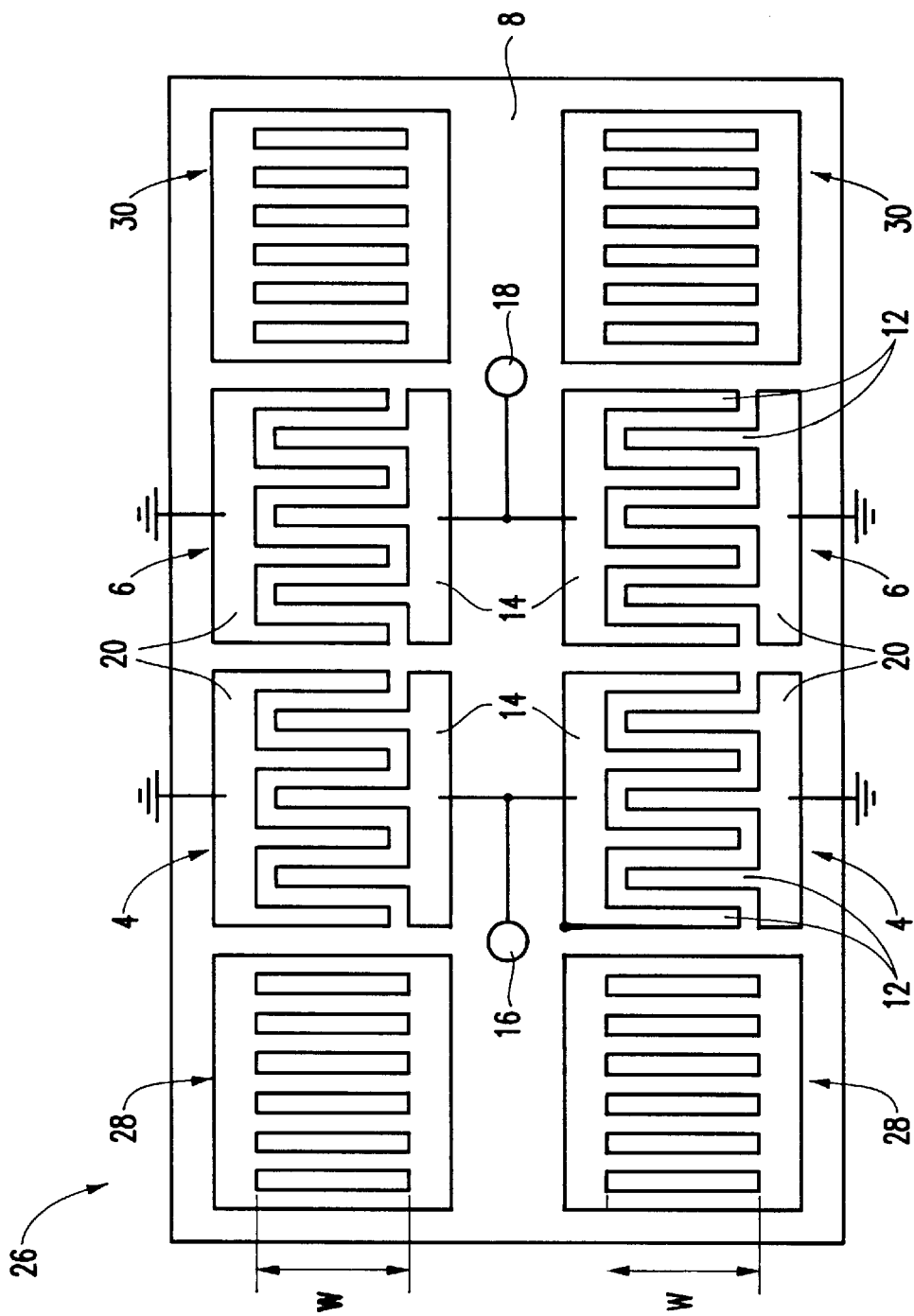
FIG. 5 is a plan view of a surface acoustic wave filter according to a second embodiment of the present invention.

Referring to FIG. 5, there is shown a surface acoustic wave filter according to a second embodiment of the present invention. In this figure, elements identical to those in FIG. 3 are designated by the same reference numerals and symbols and will not be described in detail herein.

In this surface acoustic wave filter 26, a pair of grating reflectors 28, 30 are formed on piezoelectric substrate 8 to sandwich IDTs 4, 6 on an input side and on an output side therebetween. Furthermore, two sets each made of IDTs 4, 6 and a pair of grating reflectors 28, 30 are formed on piezoelectric substrate 8. These grating reflectors 28, 30 are formed by depositing a thin film made of aluminum or an alloy of aluminum on piezoelectric substrate 8 in this embodiment similarly to IDTs 4, 6.

The aperture width of the surface acoustic wave transmission path formed of respective grating reflectors 28, 30 is substantially coincident with the aperture width W of the surface acoustic wave transmission path made of IDTs 4, 6.

Electrodes 14 of the respective IDTs 4 are both connected to input terminal 16 and electrodes 14 of the respective IDTs 6 are both connected to output terminal 18. On the other hand, electrodes 20 of the respective IDTs 4 and electrodes 20 of the respective IDTs 6 are both grounded.

In surface acoustic wave filter 26 of the second embodiment, to satisfy the equations (1), (2), the product N$\epsilon$ of the total number N of the pairs of electrode digits 12 and a reflection coefficient $\epsilon$ per electrode digit is set to be 3.9, the product fH of the center frequency f and the thickness H of electrode digits 12 is set to be 70, and the aperture width W of the surface acoustic waveguide path is set to be 5.5$\lambda$, respectively.

In surface acoustic wave filter 26 of the second embodiment constructed above, when an alternating signal is supplied from input terminal 16, each IDT 4 causes a surface acoustic wave to be excited on piezoelectric substrate 8. The wave is propagated in a direction orthogonal to the extending direction of each electrode digit 12 constituting IDT 4, forms a standing wave while repeating multiple reflection between IDTs 4 and 6 and grating reflectors 28, 30, and is received in each IDT 6 and then outputted from output terminal 18 as an electric signal.

Figure 6:
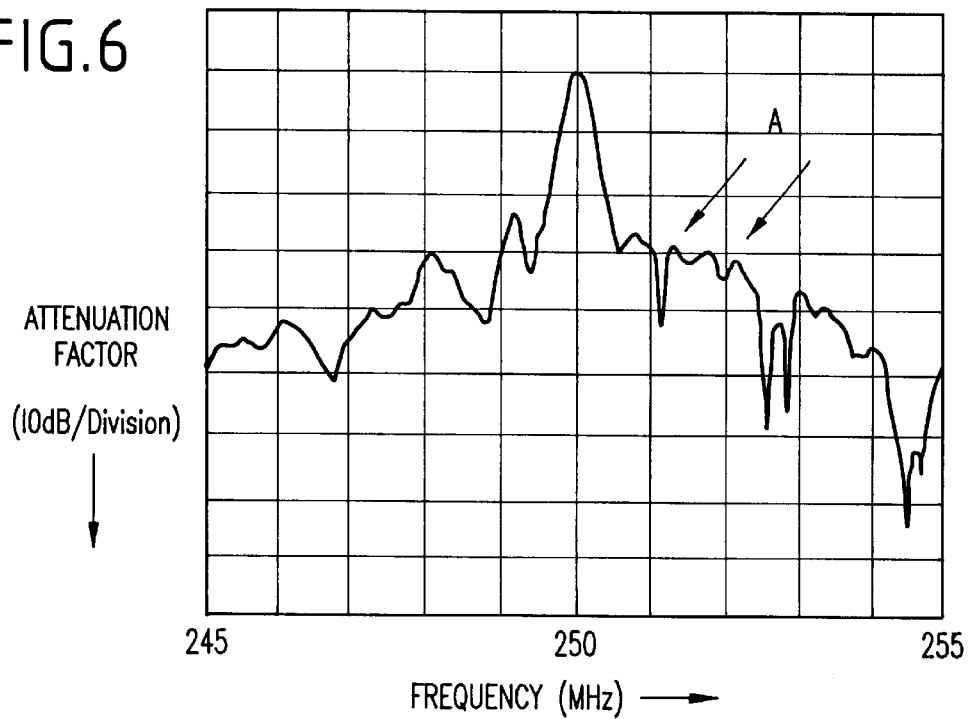
FIG. 6 is a graph showing the frequency characteristic of the surface acoustic wave filter of FIG. 5.
Figure 7:
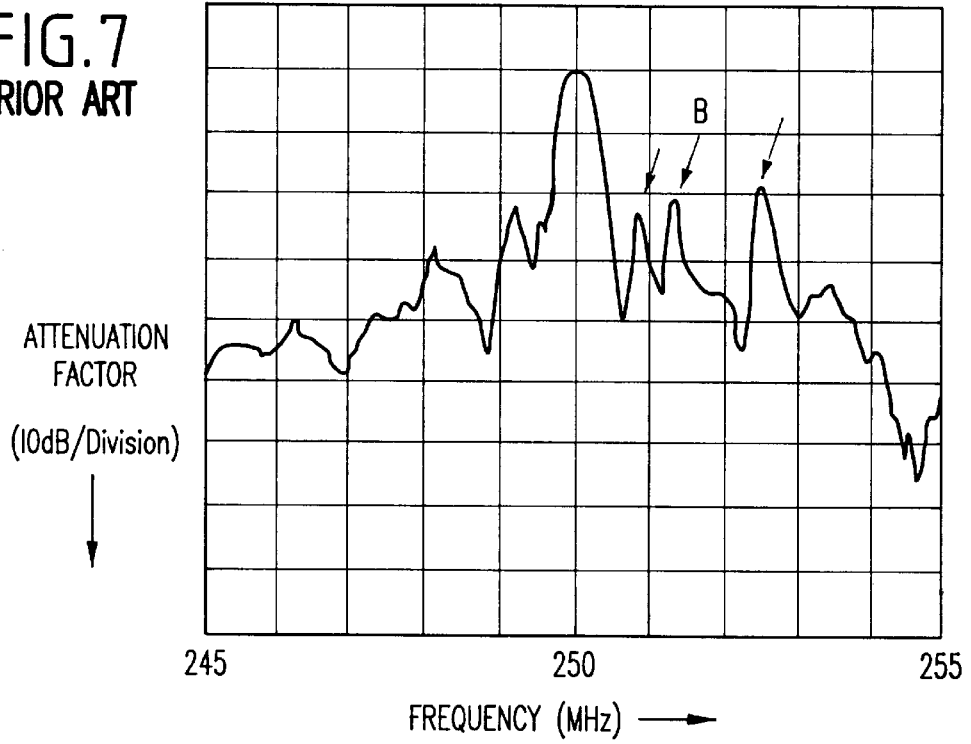
FIG. 7 is a graph showing the frequency characteristics of a conventional surface acoustic wave filter.

FIG. 6 is a graph showing the frequency characteristic of the surface acoustic wave filter of the second embodiment. FIG. 7 is a graph showing the frequency characteristics of a conventional surface acoustic wave filter. In each of these figures, the horizontal axis represents the frequency and the vertical axis represents the attenuation factor. In the conventional surface acoustic wave filter, the aperture width of the surface acoustic wave transmission path is set to be 11$\lambda$ (i.e. 5.5×2) to obtain the same condition as that of surface acoustic wave filter 26 of the second embodiment.

Comparison between the levels of the spurious signals occurring near arrows A, B respectively in FIG. 6 and FIG. 7, shows that the spurious signals are suppressed by 10 dB or more in the frequency characteristic of surface acoustic wave filter 26 of this embodiment shown in FIG. 6 as compared with that in the conventional case in FIG. 7, thereby revealing that the characteristic of surface acoustic wave filter 26 as a band-pass filter is significantly improved.

The parallel connection of two IDTs 4, 6 in this embodiment enables input and output impedance to be suppressed as compared with the first embodiment, so that the spurious signals can be suppressed without increasing the input and output impedance.

In order to clarify how the parameters are set to obtain the spurious signal suppressing effect in the surface acoustic wave filter having a construction such as surface acoustic wave filter 26, various surface acoustic wave filters having different parameters were actually made and the levels of the spurious signals were investigated.

Figure 8:
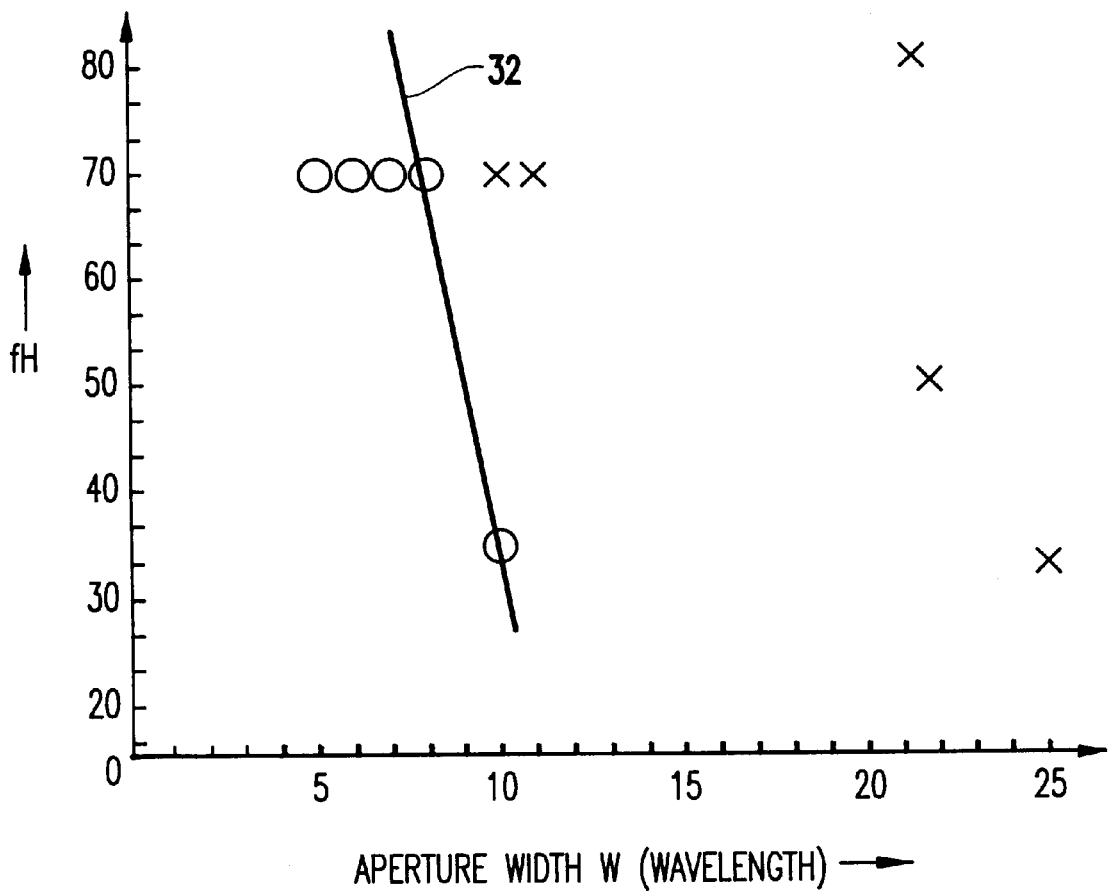
FIG. 8 is a graph showing a relationship between a spurious signal suppressing effect and parameters.

FIG. 8 is a graph showing the result of the investigation. In the graph, the horizontal axis represents the aperture width W and the vertical axis represents the product of the center frequency f and the thickness H of the electrode digits. The O marks and X marks in the graph respectively correspond to the surface acoustic wave filters made. The O marks indicate that the level of the spurious signal was suppressed by 3 dB or more as compared with conventional case (i.e. suppressed to ½ or less) and the X marks indicate that such a suppression effect was not obtained.

As can be seen from the graph of FIG. 8, all of the O marks exist on straight line 32 or on the left hand of straight line 32 while the X marks exist on the right hand of straight line 32. Thus, it is shown that the suppression effect of the spurious signal can be sufficiently obtained on straight line 32 or on the left hand of straight line 32 while a sufficient suppression effect of the spurious can not be obtained on the right hand of straight line 32. This straight line 32 is represented by fH=−17.5W+210. Therefore, the spurious signal can be suppressed by setting the aperture width W, the center frequency f, and the thickness H of the electrode digits so as to satisfy the equation (2).

Figure 9:
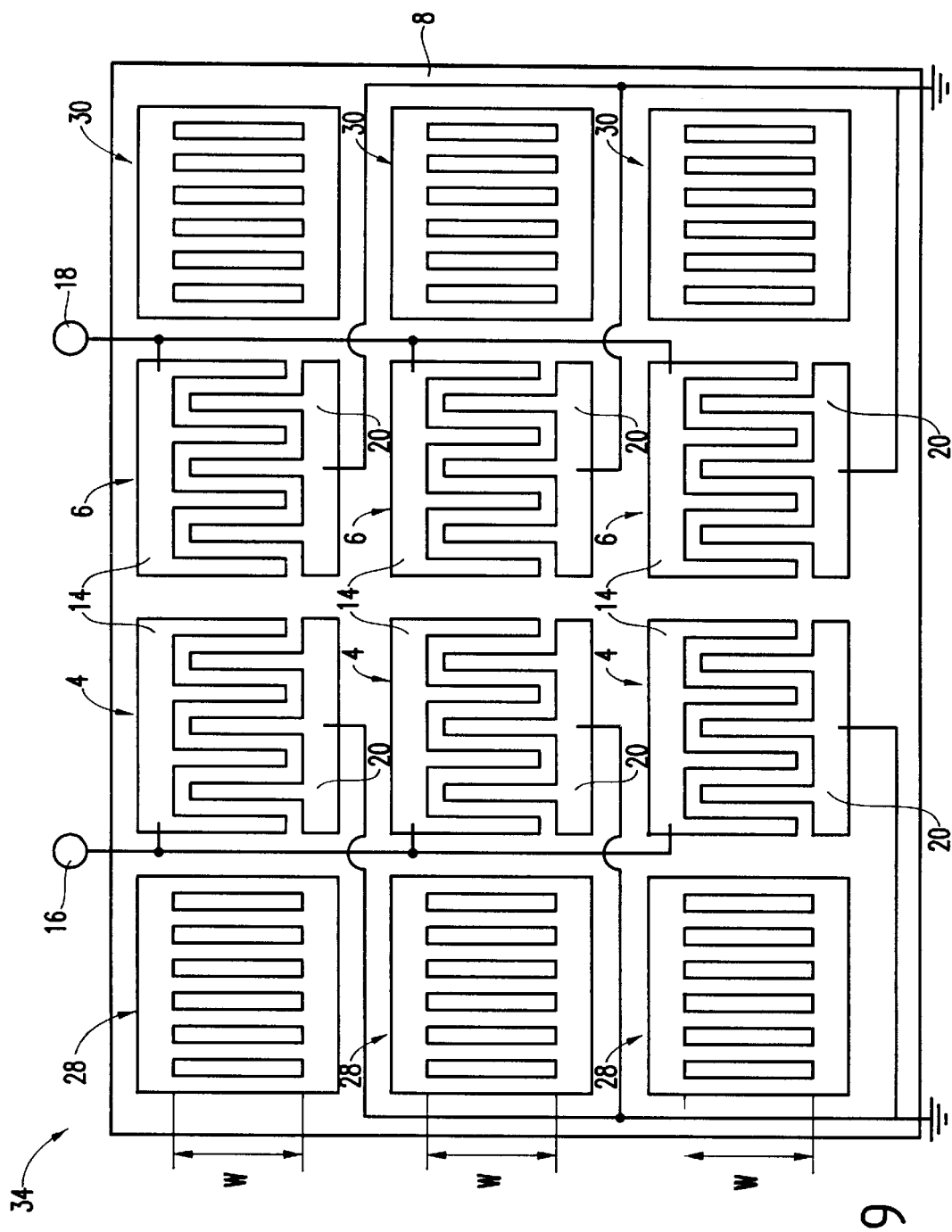
FIG. 9 is a plan view of a surface acoustic wave filter according to a third embodiment of the present invention.

FIG. 9 is a plan view showing a surface acoustic wave filter according to a third embodiment of the present invention. In the figure, elements identical to those in FIG. 5 are designated by the same reference numerals and symbols.

This surface acoustic wave filter 34 differs from surface acoustic wave filter 26 according to the second embodiment in that a further set of IDTs 4, 6 and a pair of grating reflectors 28, 30 are added in the surface acoustic wave filter 34.

Electrodes 14 of respective IDTs 4 are all connected to input terminal 16 and electrodes 14 of respective IDTs 6 are all connected to output terminal 18. Also, electrodes 20 of respective IDTs 4, 6 are all grounded.

The parallel connection of three IDTs 4, 6 in this embodiment enables input and output impedance to be further suppressed as compared with the second embodiment, so that the spurious signal can be suppressed without increasing the input and output impedance.

Although piezoelectric substrate 8 is made of the ST cut crystal substrate in the afore mentioned embodiments, lithium tantalate (LiTaO3), lithium niobate (LiNbO3), lithium tetraborate (Li2B4O7) and the like may be used for piezoelectric substrate 8 without being limited to the crystal substrate. Similar effects can be obtained by using those materials.

While preferred embodiments of the present invention have been described using specific terms, such description is for illustrative purposes only, and it is to be understood that changes and variations may be made without departing from the spirit or scope of the following claims.

What is claimed is:

1. A surface acoustic wave filter comprising:

Inter Digital Transducers (IDTs) on an input side and on an output side each including a plurality of pairs of electrode digits, said IDTs being formed on a piezoelectric substrate with a spacing interposed therebetween, wherein $N\epsilon \geq 0.55$ is satisfied where $\epsilon$ is a reflection coefficient of the electrode digit and N is the total number of the pairs of the electrode digits constituting said IDTs on the input side and on the output side, and wherein $fH \leq -17.5W+210$ is satisfied where $W\lambda$ is an aperture width of a surface acoustic wave transmission path formed of said IDTs on the input side and on the output side, f in units of Hertz is the center frequency of said filter, and H in units of meters is the thickness of the electrode digits.

2. The surface acoustic wave filter according to claim 1, further comprising a pair of grating reflectors formed on the piezoelectric substrate to sandwich said IDTs on the input side and on the output side therebetween.

3. The surface acoustic wave filter according to claim 2, wherein a plurality of sets of said IDTs on the input side and on the output side and said pair of grating reflectors are formed on the piezoelectric substrate and wherein said IDTs on the input side are electrically connected in parallel to each other and said IDTs on the output side are electrically connected in parallel to each other.

4. The surface acoustic wave filter according to claim 3, wherein two or three sets of said IDTs on the input side and on the output side and said pair of grating reflectors are formed on the piezoelectric substrate.

5. The surface acoustic wave filter according to claim 1, wherein the piezoelectric substrate is formed of crystal.

6. The surface acoustic wave filter according to claim 5, wherein the piezoelectric substrate is an ST cut crystal substrate.

7. The surface acoustic wave filter according to claim 1, wherein the piezoelectric substrate is formed of lithium niobate.

8. The surface acoustic wave filter according to claim 1, wherein the piezoelectric substrate is formed of lithium tetraborate.

9. The surface acoustic wave filter according to claim 1, wherein the piezoelectric substrate is formed of lithium tantalate.

10. The surface acoustic wave filter according to claim 1, wherein the electrode digit is made of aluminum.

11. The surface acoustic wave filter according to claim 1, wherein the electrode digit is made of an alloy of aluminum.

* * * * *